United States Patent [19]

Fogarty et al.

[11] 4,181,564

[45] Jan. 1, 1980

[54] FABRICATION OF PATTERNED SILICON NITRIDE INSULATING LAYERS HAVING GENTLY SLOPING SIDEWALLS

[75] Inventors: Thomas N. Fogarty, Allentown; William R. Harshbarger, Bethlehem; Roy A. Porter, Whitehall, all of Pa.

[73] Assignee: Bell Telephone Laboratories, Incorporated, Murray Hill, N.J.

[21] Appl. No.: 899,535

[22] Filed: Apr. 24, 1978

[51] Int. Cl.² .................. H01L 21/285; H01L 21/306
[52] U.S. Cl. ..................... 156/643; 156/646; 156/657; 156/662; 204/192 EC; 427/38; 427/88; 427/94; 427/95
[58] Field of Search .............. 156/628, 643, 646, 657, 156/662, ; 204/192 EC, 164; 427/94, 95, 88, 38

[56] References Cited

U.S. PATENT DOCUMENTS

| | | | |
|---|---|---|---|
| 3,652,324 | 3/1972 | Chu et al. | 427/94 |
| 3,665,548 | 5/1972 | Brack et al. | 156/643 |
| 3,675,319 | 7/1972 | Smith | 29/625 |
| 3,769,109 | 10/1973 | MacRae et al. | 156/643 |
| 3,795,557 | 3/1974 | Jacob | 252/79.1 |
| 3,880,684 | 4/1975 | Abe | 252/79.1 |
| 3,892,606 | 7/1975 | Chappelow et al. | 156/657 |
| 3,940,506 | 2/1976 | Heinecke | 427/38 |
| 3,986,912 | 10/1976 | Alcorn et al. | 204/192 E |
| 4,022,930 | 5/1977 | Fraser | 427/86 |
| 4,057,895 | 11/1977 | Ghezzo | 156/628 |

OTHER PUBLICATIONS

Rozich, "Reactive Etching of Silicon Nitride" *IBM Technical Disclosure Bulletin.* vol. 19, No. 11 (4/77) p. 4157.
Somekh, "Introduction . . . Etching " *Journal of Vacuum Science Technology,* vol. 13, No. 5 Sep./Oct. 1976 pp. 1003–1007.
Taft, "Characterization of Silicon Nitride Films", *J. of The Electrochemical Society: Solid State Science,* (8/71) 1341–1347.
Rosler et al., "A Production . . . Deposition" *Solid State Technology* (6/75) pp. 45–50.
Rand et al., "Optical Absorption . . . Deposition" J. of the Electrochemical Society.

*Primary Examiner*—Jerome W. Massie
*Attorney, Agent, or Firm*—Lester H. Birnbaum

[57] ABSTRACT

A method of forming patterned insulating layers such as silicon nitride for use in integrated circuit fabrication is disclosed. The insulating layer is formed by reactive plasma deposition while the temperature of the substrate is decreased. This diminishing temperature affects the etching characteristics of the layer such that when openings are formed by a selective plasma etching, the sidewalls will be sloped at an acute angle with the substrate even when the layer is overetched.

12 Claims, 6 Drawing Figures

FABRICATION OF PATTERNED SILICON NITRIDE INSULATING LAYERS HAVING GENTLY SLOPING SIDEWALLS

BACKGROUND OF THE INVENTION

This invention relates to the fabrication of integrated circuits, and in particular to the formation of patterned insulating layers in said circuits.

In many types of integrated circuits, such as bipolar or MOS memory circuits, it is necessary to form multiple levels of metal with intervening layers of insulating material. Typically, this insulating layer comprises silicon nitride. In order to make contact to the various metal layers and the circuit components in the semiconductor substrate, openings must be formed in the insulating layers. This is typically done by depositing a photoresist layer over the insulating layer, exposing and developing the photoresist so that a desired pattern is formed, and then etching openings through the insulating layer in the exposed areas of photoresist. Etching can be done by a variety of methods such as chemical, vapor, or reactive plasma etching.

A persistent problem which arises in such a technique is the inability to control the slope of the sidewalls of the openings. For example, when a silicon nitride layer is formed by plasma deposition and the openings are etched by reactive plasma techniques for too long a period of time, the sidewalls will tend to form an abrupt angle with the surface on which the layer was deposited (usually ranging from 80 to 110 degrees). With such sidewall geometry, it is difficult to cover the layer and openings with a continuous metal layer and shorts develop. Furthermore, when the layer is formed on the surface of the substrate and it is desired to contact a defined region, the production of sidewalls with an angle greater than 90 degrees can result in a contact area at the surface which is greater than the defined region.

The invention is therefore directed to the problem of providing a method for etching openings in insulating layers, particularly silicon nitride layers, which will produce gradually sloped sidewalls at an acute angle with the surface on which the layer is formed. Such sloped sidewalls would permit essentially complete coverage by a continuous metal layer and insure contact within a defined area of the surface.

SUMMARY OF THE INVENTION

This problem is solved in accordance with the invention. The silicon nitride layer is formed on a surface by reactive plasma deposition. During such deposition, the temperature of the surface is decreased in order to vary the etching characteristic of the layer. When openings are subsequently formed in the layer by plasma etching, the varying etching characteristic produces gradually sloped sidewalls.

DESCRIPTION OF THE DRAWING

These and other features of the invention are delineated in detail in the following description. In the drawing.

It will be understood that for purposes of illustration these figures are not drawn to scale.

DETAILED DESCRIPTION

Figure 1:
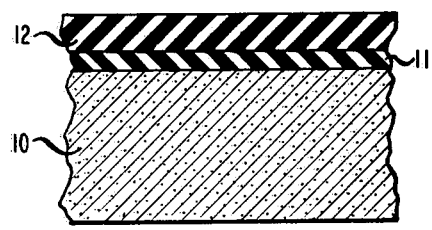
FIGS. 1-3 are cross-sectional views of a portion of a semiconductor wafer during various stages of fabrication illustrating one embodiment of the invention.

The invention in accordance with one illustrative embodiment will be described with reference to the sequence of steps shown in FIGS. 1-3. In FIG. 1, a portion of a semiconductor wafer, 10, is shown with a layer, 11, of $SiO_2$ formed on one major surface. In this example, a standard N doped silicon wafer with a (111) orientation was used and the $SiO_2$ layer was thermally grown to a thickness of approximately 7000 Angstroms. The $SiO_2$ layer serves as an etch stop in the subsequent etching operations and is not necessary for the practice of the invention. Deposited on the $SiO_2$ layer was a layer, 12, of silicon nitride. In accordance with a key feature of the invention, the silicon nitride was deposited by reactive plasma techniques in such a manner that the etching characteristics were varied through the thickness of the layer.

Figure 6:
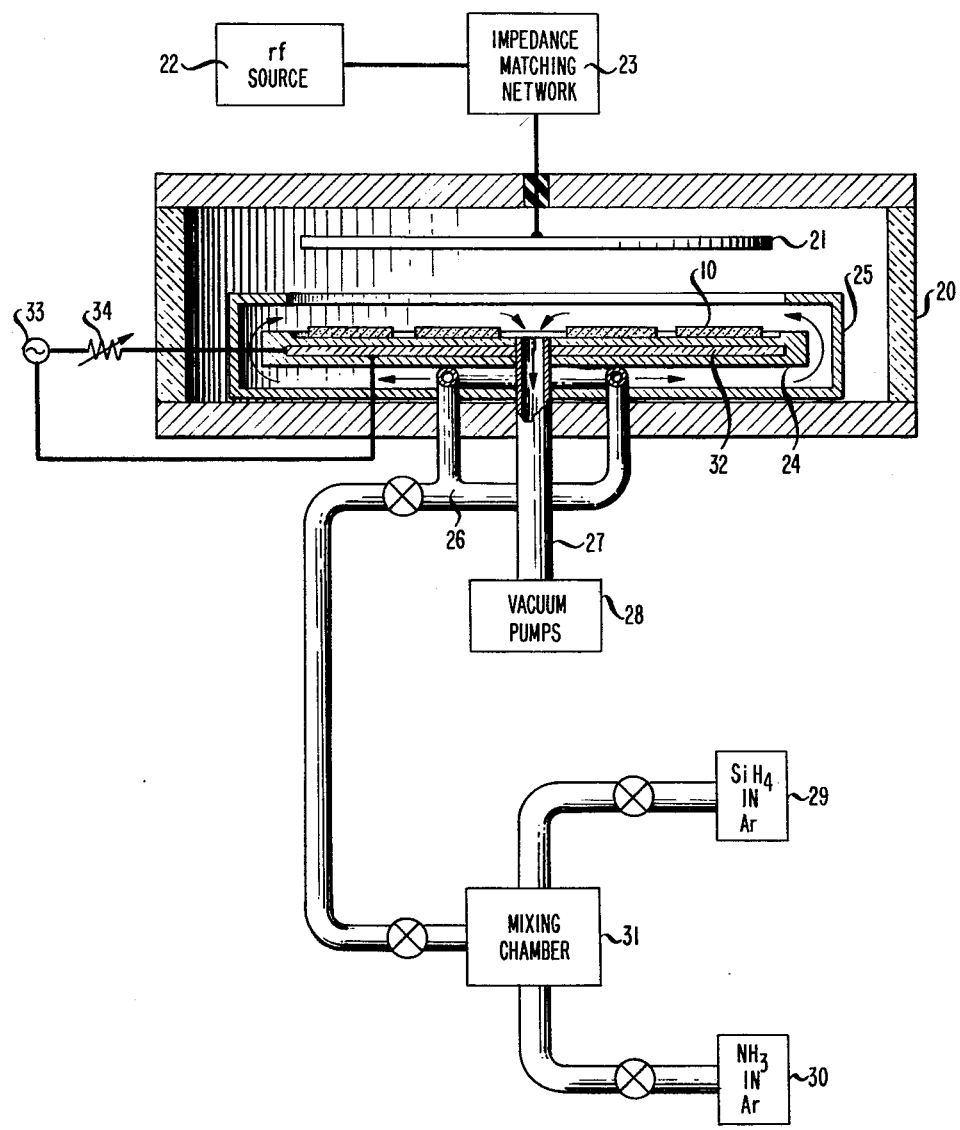
FIG. 6 is a cross-sectional, partly schematic illustration of an apparatus which may be employed with the method in accordance with one embodiment of the invention.

The apparatus employed for the deposition in this particular example is illustrated in FIG. 6. The apparatus is a radial flow reactor, one example of which is shown in U.S. Patent Application of Hauser and Sinha, Ser. No. 651,556, filed Jan. 22, 1976 and assigned to the present assignee. Briefly, the apparatus includes an evacuated chamber, 20, a first electrode, 21, coupled to an rf source 22 through an impedance matching network 23, a second electrode 24 which supports the semiconductor wafers, 10, and a gas flow shield 25 which surrounds electrode 24 except for the portion on which the wafers are placed. Pipe 26 is provided for introducing the reaction gases into the chamber, while pipe 27 and vacuum pump 28 provide an exhaust. Sources of silane in a carrier gas of argon, 29, and ammonia in a carrier gas of argon, 30, are coupled to mixing chamber, 31, which in turn is coupled to input pipe 26. Alternatively, a single source of silane in a carrier gas of nitrogen can be provided for deposition of silicon nitride. A heater element, 32, is embedded in electrode 24 for heating the semiconductor wafers to a desired temperature. The temperature is controlled by varying the current from AC source 33 to the heater element by means of rheostat 34.

In operation, the wafers are placed on electrode 24 and the chamber 20 was evacuated to a pressure of approximately 1.0 Torr. The gases were mixed in the mixing chamber 31 in an amount of approximately 97.4 percent argon, 1.4 percent $NH_3$ and 1.2 percent $SiH_4$ and admitted to the chamber 20 with a flow rate of 1800 sccm. The gases flowed in the direction indicated by the arrows. The rf source 22 which operated at approximately 13.5 MHz was actuated to the desired level, in this example approximately 80 watts, to create the rf glow discharge reaction between electrodes 21 and 24. The power was on for approximately 45 minutes. As known in the art, the plasma discharge caused the decomposition of the silane and ammonia to produce silicon and nitrogen which reacted to form the layer of silicon nitride. The total time of deposition was approximately 45 minutes resulting in a layer thickness of approximately 2μ.

It should be appreciated that although the layer thus formed is generally referred to in the art as a silicon nitride layer, it differs from the $Si_3N_4$ layer formed by chemical and vapor techniques. The layer is actually in the nature of a polysilazane inorganic polymer which includes hydrogen as well as silicon-nitrogen bonds and typically had the composition $Si_{0.7-1.3} N_{0.7-1.3} H_{0.3-0.7}$. However, since the material is predominantly silicon and nitrogen, and it is accepted in the art as a "silicon nitride," this designation is used in the present application.

In accordance with a key feature of the invention, the temperature of the wafer was incrementally decreased during the deposition of the silicon nitride layer. In this example, the wafers were initially heated to a temperature of 375 degrees C. at the time of activation of the rf power source. At intervals of approximately 10 minutes, the rheostat was set to lower the temperature approximately 25 degrees C. A final temperature setting of 270 degrees C. was made after 40 minutes and maintained until the end of the deposition.

Figure 2:
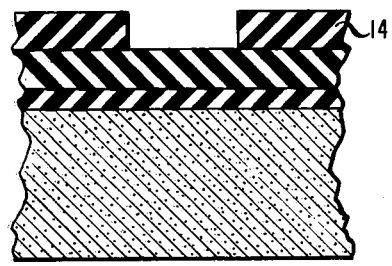

In the next step, as illustrated in FIG. 2, the silicon nitride layer was covered with a photoresist mask 14. The mask was formed by standard photolithographic techniques of depositing the photoresist, exposing areas to be removed to light, and developing to expose the desired portions of the underlying silicon nitride layer. The particular resist used was a negative photoresist manufactured by Hunt with the designation SC 450 with a thickness of 4μ. Of course, any mask material which permits selective etching by plasma techniques can be used.

Next the masked wafers were placed in the same type of apparatus as that in FIG. 6 except that separate sources of $CF_4$ and $O_2$ were used instead of the silane and ammonia sources. The use of $O_2$ is preferred for speeding the reaction, but is not essential. Here, the chamber 20 was evacuated to approximately 0.3 Torr. The $CF_4$ gas and the $O_2$ gas were mixed in a mixing chamber to give a mixture of approximately 92% $CF_4$ and 8% $O_2$ and admitted to the chamber at a flow rate of 130 sccm. The rf source 22 which operated at approximately 13.5 MHz was actuated to give a power of approximately 150 watts. As known in the art, this procedure produces a plasma which will etch the silicon nitride layer. The etching was carried out for approximately 8 minutes.

Figure 3:
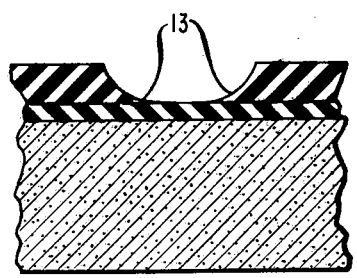

After stripping the photoresist, the structure essentially as shown in FIG. 3 resulted. It will be noted that the etched opening in the silicon nitride layer had sidewalls, 13, with a gradual slope which made an angle of approximately 30 degrees at its base with the plane of the major surface of the wafer. This result can be compared with the usual etch profile shown in FIG. 4 obtained when the temperature of the wafer is kept constant during the plasma etch. Since plasma etching of silicon nitride is substantially isotropic, the sidewalls 13 are essentially vertical when there is overetching. That is, although the walls could be sloped if the etching proceeded just enough to ensure removal of the layer, such control is not practical and vertical walls result as the layer is overetched (See, for example, Somekh "Introduction to Ion and Plasma Etching," *Journal of Vacuum Science and Technology*, Vol. 13, No. 5, p. 1003–1007 (Sept./Oct. 1976)). The inventive method therefore produces sloped sidewalls without the necessity of this careful control of etching time. That is, the sloped sidewalls should be produced by the invention regardless of the etching time as long as the layer is etched through. Advantageously, the angle of the sidewalls at the deposition surface should be less than 60 degrees.

Figure 4:
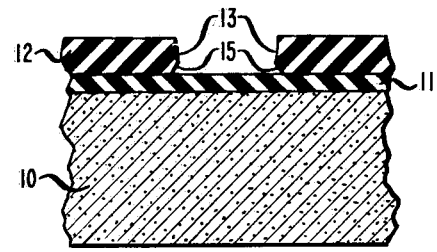
FIG. 4 is a cross-sectional view of a portion of a semiconductor wafer during one stage of fabrication in accordance with a prior art technique illustrating one of the problems solved by the present invention.

It will also be noted in FIG. 4 that there is a tendency for a re-entrant portion 15, to form in the sidewalls. This apparently results when the temperature, which was constant in the prior art, was not carefully controlled. Such a profile can be a problem where an isolated region in the semiconductor is to be contacted. The present invention therefore has an additional advantage in insuring that the exposed semiconductor area is less than the area of the mask opening.

It is not entirely understood why the decreasing temperature results in the sloped profile. Prior art teachings for achieving sloped walls in various layers with different methods of deposition employing decreasing temperatures and chemical etching have attributed this behavior to variations in crystalline order or composition gradients (See, for example, U.S. Pat. No. 3,675,319 issued to Smith). Obviously, variations in crystalline disorder do not apply to amorphous polymeric layers such as silicon nitride. In addition, Auger analysis showed that the silicon nitride layers deposited by the present method maintained an essentially constant Si/N ratio throughout the thickness of the layer (the standard deviation of Si/N was less than 5%). It is theorized, therefore, that the varying etching characteristics may be due to a variation in the layer density and/or a change in the hydrogen content of the layer through its thickness.

It should be noted that although the temperature settings as described above were made in increments, there is a lag in the actual temperature of the heating element, and consequently the temperature of the deposition surface was more in the nature of a gradual decrease rather than a step function. The sloped sidewalls should result from the temperature decrease regardless of the precise profile. Thus, the temperature could be decreased in a linear fashion. It appears that desirable results will be achieved when the initial temperature is within the range of 330–375 degrees C. and the final temperature is within the range of 270–325 degrees C. A minimum temperature gradient for achieving gradually sloped walls appear to be 25 degrees C./hr and a preferred gradient for commercial production would be at least 50 degrees C./hr. A particularly useful layer for commercial applications would be produced by starting deposition at a temperature of approximately 375 degrees C. and completing at a temperature of 325 degrees with a deposition time sufficient to produce a layer approximately 1μ thick.

Of course, it will be realized that the other parameters given above are those of just one illustrative embodiment of the invention and a range of values is possible. As a guide to the further utilization of the invention, and not as a limitation thereof, a suitable range of parameters is presented below:

| Silicon Nitride Deposition | |
|---|---|
| Proportion of $SiH_4$ | 1–3% |
| Proportion of $NH_3$ | 0–3% |
| Proportion of Ar or $N_2$ | 94–99% |
| Gas Flow | 500–3000 SCCM |

| | |
|---|---|
| Pressure | .25–1.5 Torr |
| RF Power | 30–1200 Watts |
| Frequency | 50 kHz–25 MHz |
| Thickness of Deposited Layer | 0.3–2.0 μm |
| Plasma Etching | |
| Proportion of $CF_4$ | 80–100% |
| Proportion of $C_2$ | 0–20% |
| Gas Flow | 50–200 SCCM |
| Pressure | 0.2–1.0 Torr |
| rf Power | 100–500 Watts |
| Frequency | 50 kHz–25 MHz |
| Etching Time | 5–20 Min. |

Figure 5:
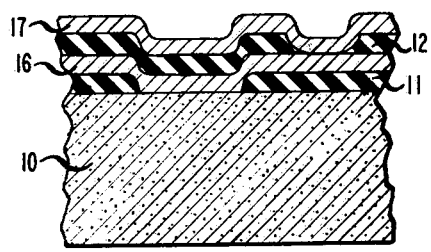
FIG. 5 is a cross-sectional view of a portion of a biplar or MOS memory integrated circuit utilizing the invention in accordance with one embodiment.

The inventive method is particularly advantageous in producing multi-level structures such as illustrated in the portion of a bipolar or MOS memory circuit shown in FIG. 5, where elements corresponding to those in FIGS. 1–3 are similarly numbered. In this circuit, contact is made to the semiconductor wafer 10 through an opening in $SiO_2$ layer 11 by a layer 16, of metal such as aluminum. The silicon nitride layer 12, is deposited on the metal layer and an opening is etched as described above. A layer of another metal 17, such as titanium, platinum or aluminum is then deposited over the silicon nitride layer including the opening so that contact is made to the underlying metal layer 16. The gradual slope of the sidewalls in the silicon nitride layer produced by the inventive method therefore insures that the overlying metal layer will be continuous and voids and discontinues at the opening are avoided.

Various additional modifications will become apparent to those skilled in the art. All such variations which basically rely on the teachings through which the invention has advanced the art are properly considered within the spirit and scope of the invention.

We claim:

1. A method for fabricating semiconductor integrated circuits including a method for fabricating amorphous layers (12) comprising $Si_{0.7-1.3}N_{0.7-1.3}H_{0.3-0.7}$ with openings therein on a surface comprising the steps of forming on said surface the amorphous layer by plasma deposition and forming said openings by plasma etching in selected areas of the layer, CHARACTERIZED IN THAT the temperature of said surface is decreased during the deposition of the amorphous layer such that the etching rate through the layer is varied to produce openings having sidewalls (13) which are sloped at an acute angle with respect to said surface.

2. The method according to claim 1 wherein the amorphous layer is deposited in a radial flow reactor with reaction gases of silane and ammonia in a carrier gas of argon.

3. The method according to claim 1 wherein the amorphous layer is etched in a radial flow reactor with reaction gases of $CF_4$ and $O_2$.

4. The method according to claim 1 wherein the temperature range during the deposition of the amorphous layer is 270 degrees–375 degrees C.

5. The method according to claim 1 wherein the ratio of silicon to nitrogen in the deposited layer is essentially constant through the layer.

6. The method according to claim 1 further comprising the step of forming a metal layer over the amorphous layer including the openings therein.

7. The method according to claim 1 wherein the temperature gradient during the deposition of the amorphous layer is at least 25 degrees C./hr.

8. The method according to claim 1 wherein the initial temperature of the surface is within the range 330–375 degrees C. and the final temperature is within the range 270–325 degrees C.

9. The method according to claim 1 wherein the openings are etched through the amorphous layer and the sloped sidewalls are produced independent of the amount of overetching of the layer.

10. In a method for fabricating semiconductor integrated circuits, a method for fabricating multilevel structures on a surface comprising the steps of forming on said surface a layer of $Si_{0.7-1.3}N_{0.7-1.3}H_{0.3-0.7}$ (12) by plasma deposition in a reaction chamber (20) including a mixture of silane and ammonia in a carrier gas of argon, forming openings through selected areas of said layer of plasma etching in a reaction chamber including a mixture of $CF_4$ and $O_2$, and depositing a layer of metal (17) over said layer including said openings, CHARACTERIZED IN THAT the temperature of the surface during the deposition of the $Si_{0.7-1.3}N_{0.7-1.3}H_{0.3-0.7}$ layer is initially within the range 330–375 degrees C. and is decreased to a final temperature within the range 270–325 degrees C. such that the etching produces openings having sloped sidewalls (13) forming acute angles at the base of the layer of less than 60 degrees with respect to said surface independent of the amount of overetching of the layer.

11. The method according to claim 9 wherein the temperature at the start of deposition of the $Si_{0.7-1.3}N_{0.7-1.3}H_{0.3-0.7}$ layer is approximately 375 degrees C. and at the termination of deposition is approximately 325 degrees C.

12. The method according to claim 9 wherein the temperature gradient during the deposition of said $Si_{0.7-1.3}N_{0.7-1.3}H_{0.3-0.7}$ layer is at least 25 degrees C./hr.

* * * * *